United States Patent
Kim et al.

(10) Patent No.: US 7,330,143 B2
(45) Date of Patent: Feb. 12, 2008

(54) DIGITAL/ANALOG CONVERTER

(75) Inventors: Byung Hoon Kim, Seoul (KR); Won Tae Choi, Gyeonggi-do (KR); Youn Joong Lee, Seoul (KR); Chan Woo Park, Gyeonggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 0 days.

(21) Appl. No.: 11/428,363

(22) Filed: Jun. 30, 2006

(65) Prior Publication Data

US 2007/0040719 A1 Feb. 22, 2007

(30) Foreign Application Priority Data

Aug. 8, 2005 (KR) .................. 10-2005-0072263

(51) Int. Cl.
*H03M 1/78* (2006.01)
(52) U.S. Cl. ..................... 341/154; 341/144
(58) Field of Classification Search ........... 341/154, 341/144
See application file for complete search history.

(56) References Cited

U.S. PATENT DOCUMENTS

| 5,739,805 | A |   | 4/1998 | Dingwall |       |
|-----------|---|---|--------|----------|-------|
| 6,075,477 | A | * | 6/2000 | Kokubun et al. | 341/154 |
| 6,249,239 | B1| * | 6/2001 | Corkum   | 341/154 |
| 7,075,469 | B2| * | 7/2006 | Yada et al. | 341/154 |

FOREIGN PATENT DOCUMENTS

JP 2005-502093 A 1/2005

OTHER PUBLICATIONS

English version of Detailed Description and Claims date unknown.

* cited by examiner

*Primary Examiner*—Rexford Barnie
*Assistant Examiner*—Joseph Lauture
(74) *Attorney, Agent, or Firm*—Lowe Hauptman Ham & Berner

(57) ABSTRACT

The present invention relates to a digital/analog converter. The digital/analog converter includes a divided-voltage generating section that divides a reference supply voltage through the voltage distribution; a decoder section that receives a digital signal so as to output a decoded selection signal; a first divided-voltage selecting section that selects and outputs a plurality of divided voltages among the divided-voltages generated from the divided-voltage generating section on the basis of the selection signal output from the decoder section; a second divided-voltage selecting section that selects and outputs a plurality of divided-voltages among the divided-voltages output from the first divided-voltage selecting section on the basis of the selection signal output from the decoder section; a divided-voltage storing section that charges and discharges the plurality of divided-voltages output from the second divided-voltage selecting section; a third divided-voltage selecting section that selects a predetermined voltage among the divided-voltages discharged from the divided-voltages storing section on the basis of the selection signal output from the decoder; and a voltage output section that outputs the predetermined voltage selected from the third divided-voltage selecting section.

13 Claims, 5 Drawing Sheets

[FIG. 1]
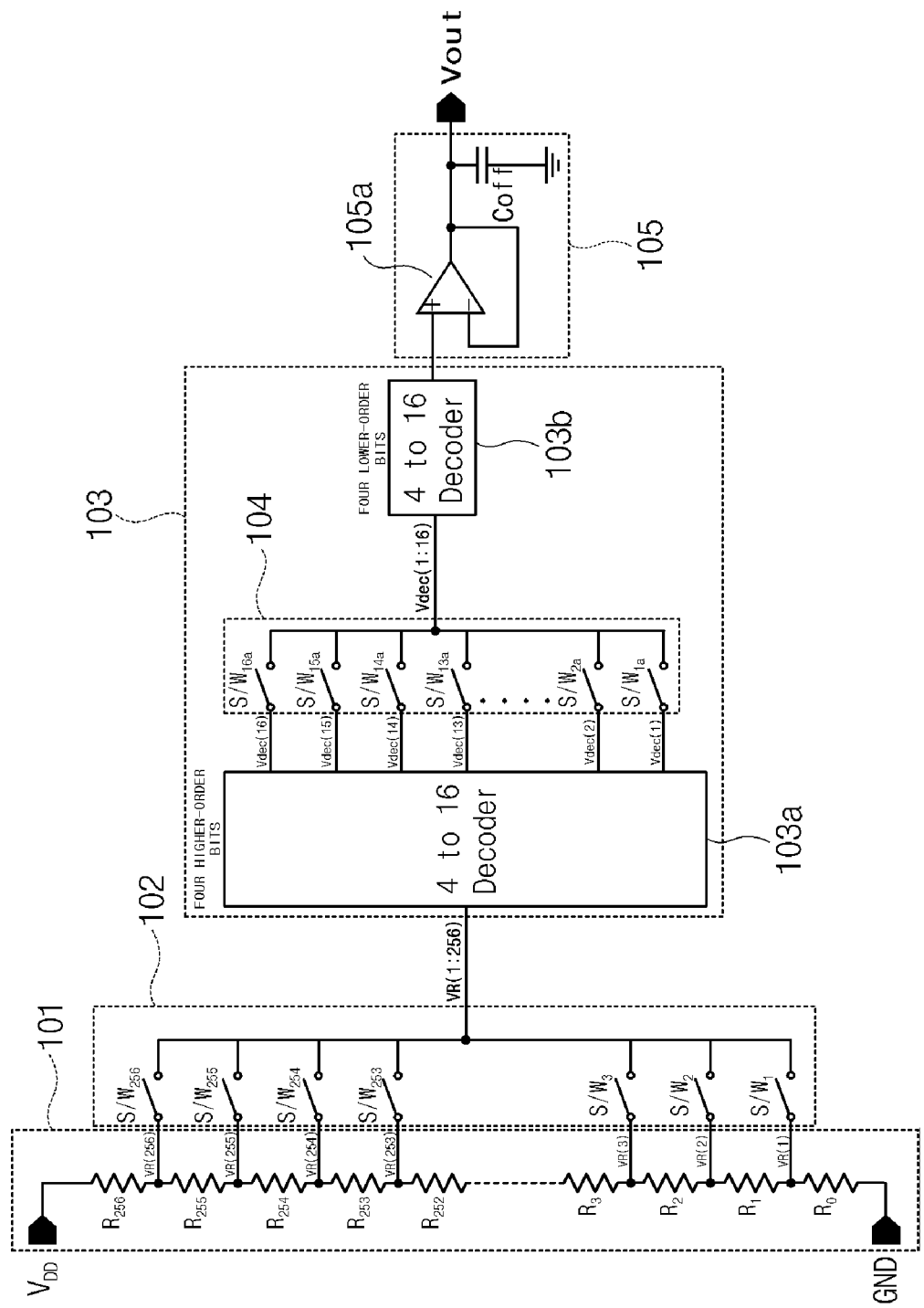

[FIG. 2]
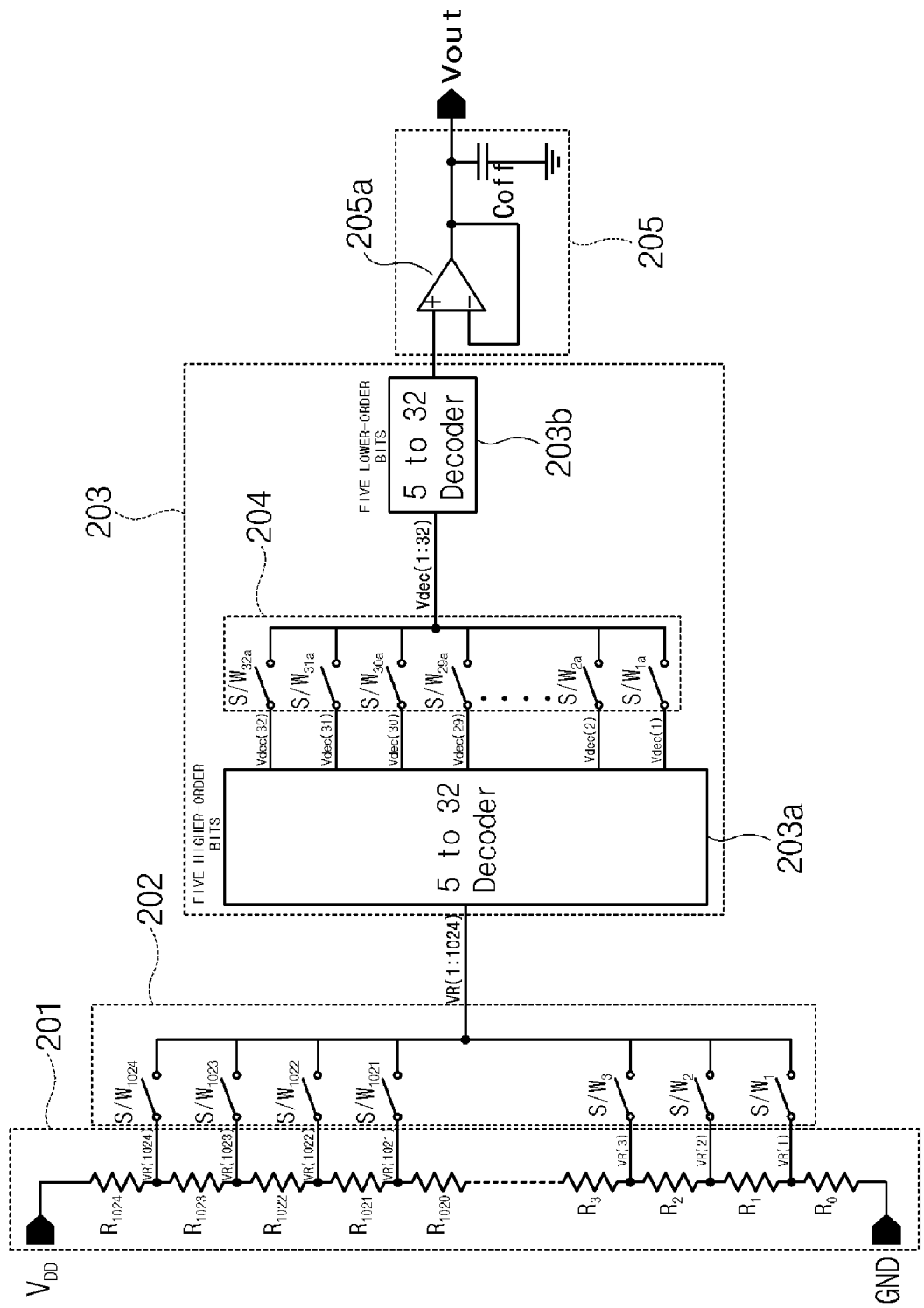

[FIG. 3]
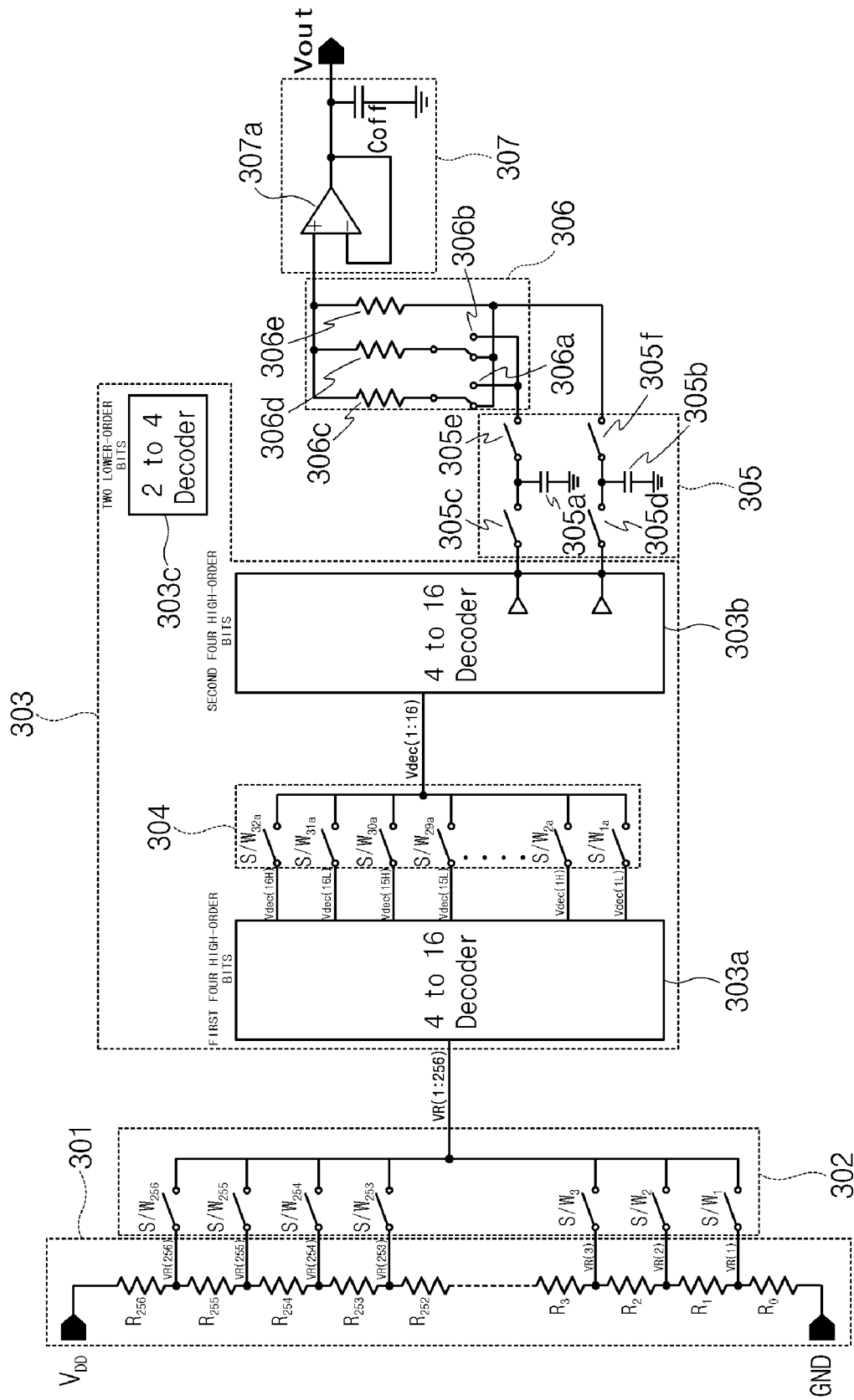

[FIG. 4A]
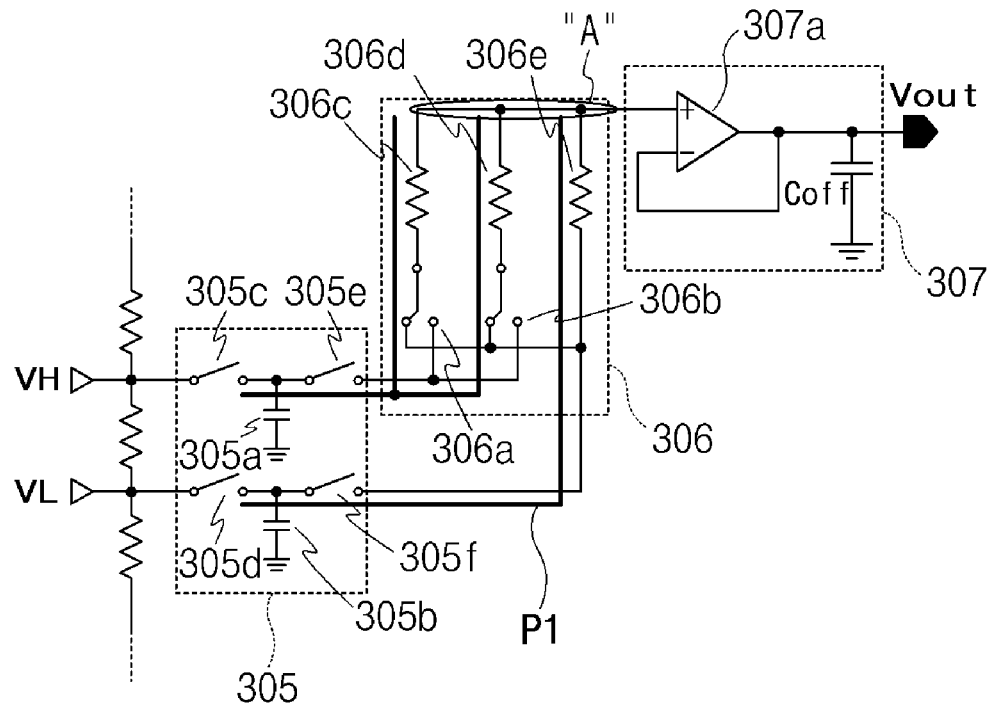
[FIG. 4B]
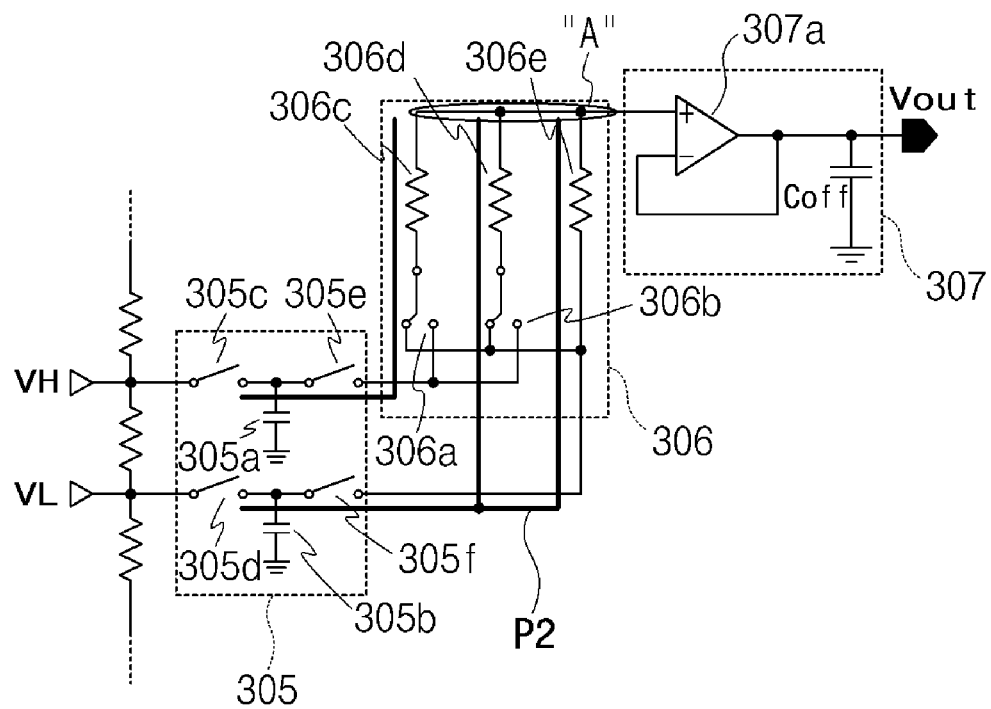

[FIG. 4C]
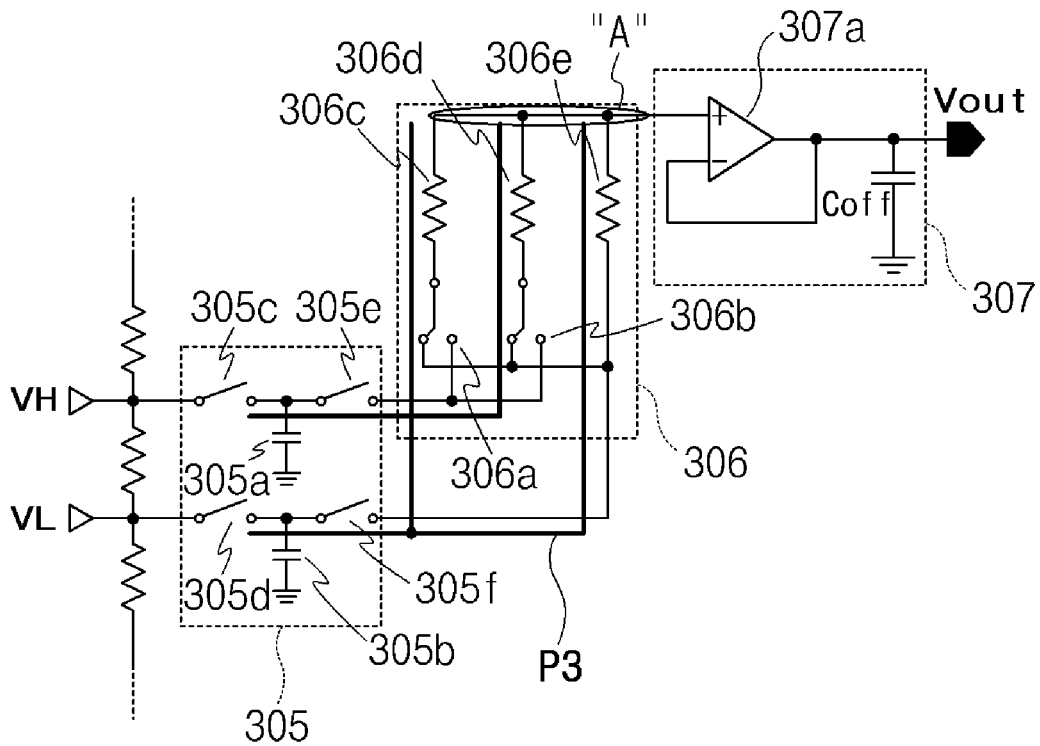
[FIG. 4D]
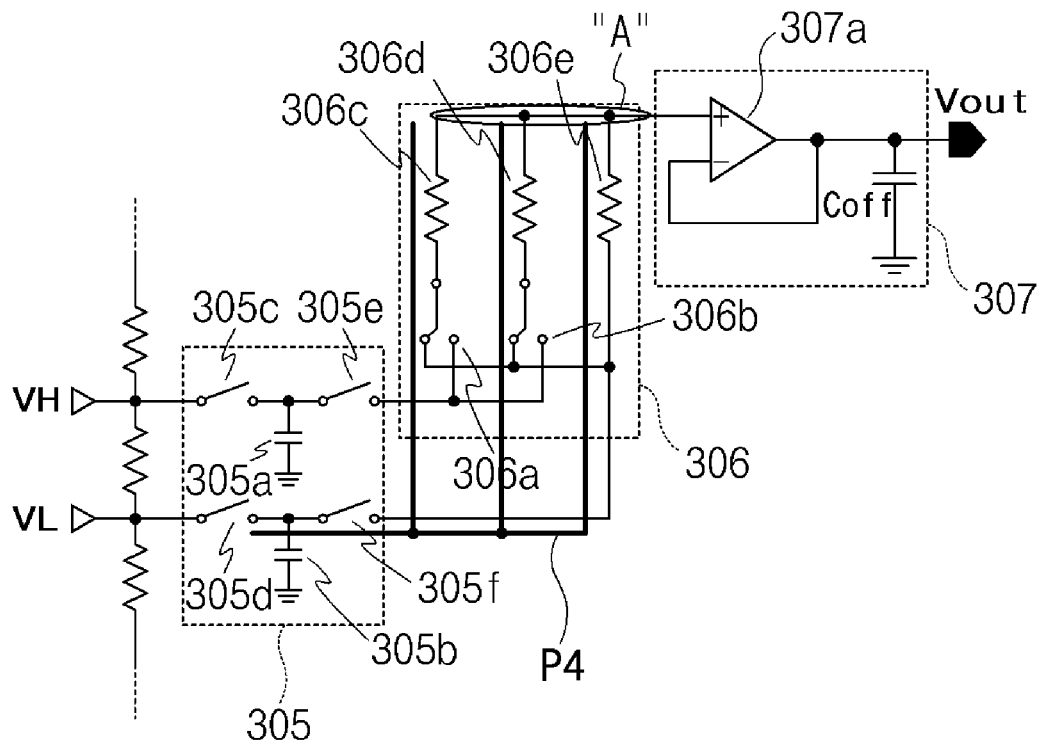

DIGITAL/ANALOG CONVERTER

CROSS-REFERENCE TO RELATED APPLICATIONS

The application claims the benefit of Korea Patent Application No. 2005-0072263 filed with the Korea Industrial Property Office on Aug. 8, 2005, the disclosure of which is incorporated herein by reference.

BACKGROUND OF THE INVENTION

1. Field of the Invention

The present invention relates to a digital/analog converter, in which a divided-voltage storing section and divided-voltage selecting section are added in a conventional digital/analog converter which processes a digital signal with an 8-bit resolution, so that a digital signal with a high resolution of more than 10 bits can be processed, the size of an IC on which the digital/analog converter is mounted can be reduced by miniaturizing the digital/analog converter, and a desired voltage can be output quickly.

2. Description of the Related Art

In general, a digital/analog converter converts a digital quantity into a corresponding analog quantity. During image sensing, the digital/analog converter determines the range of digital data which is stored according to the brightness of an image, when a user inputs a digital control code. Then, the digital/analog converter converts the digital data into an analog signal.

As a widely-used digital/analog converter, there are generally provided a converter using a resistor array, a converter using a capacitor, a converter using a current cell and the like.

In such digital/analog converters according to the related art, as the number of bits of an input signal increases, the overall area of the circuit significantly increases. In the case of the converter using a resistor array, if the number of bits of an input signal increases from 8 to 10, the number of resistors which are required for the digital/analog conversion significantly increases from $256(2^8)$ to $1024(2^{10})$. The number of switches which are accordingly needed also increases significantly. Such an increase of two bits causes the overall area of the digital/analog converter to increase four times. Such an increase in area also occurs in other digital/analog converters. Further, when a semiconductor is manufactured, an increase in the area of a circuit means an increase in cost. Therefore, in order to design a low-cost digital/analog converter, a digital/analog converter with a new structure is required, of which the overall circuit area does not increase despite an increase in the number of bits of an input signal.

FIG. 1 is a block diagram illustrating the construction of a digital/analog converter which processes a digital signal with an 8-bit resolution according to the related art.

As shown in FIG. 1, the conventional digital/analog converter which processes a digital signal with an 8-bit resolution is composed of a divided-voltage generating section 101 which divides a reference supply voltage VDD through the voltage distribution, a decoder section 103 which receives a digital signal so as to output a decoded selection signal, a first divided-voltage selecting section 102 which selects and outputs a plurality of divided-voltages among the divided-voltages generated from the first divided-voltage generating section 101 on the basis of the output selection signal, a second divided-voltage selecting section 104 which selects and outputs a plurality of divided-voltages among the divided-voltages output from the first divided-voltage selecting section on the basis of the output selection signal, and a voltage output section 105 which outputs a predetermined voltage selected by the second divided-voltage selecting section.

The first divided-voltage generating section 101 is composed of $256(2^8)$ or $257(2^8+1)$ resistors which are serially connected. One end thereof receives the reference supply voltage VDD, and the other end thereof is connected to the ground GND of the circuit. Further, predetermined divided-voltages VR1 to VR256 are respectively output from the connection points between the resistors R0 to R256, that is, the nodes formed between the resistances of the divided-voltage generating section 101.

For example, if the connection point between the resistors R1 and R2 is set to the first node and the total resistance of 257 serially-connected resistors is referred to as Rtot, a divided-voltage VRn which is output from the Nth node can be calculated by the following equation: $Vn=(R0+R1+\ldots+Rn-1)/Rtot \times VDD$ (n is in the range of 1 to 256).

The first divided-voltage selecting section 102 is provided with 256 switches S/W1 to S/W256. The switches S/W1 to S/W256 are respectively connected to the nodes formed in the first divided-voltage generating section 101.

The first divided-voltage selecting section 102 selects and outputs 16 divided-voltages among the 256 divided-voltages generated by the divided-voltage generating section 101 on the basis of the selection signal output from the decoder section 103 which will be described below.

The second divided-voltage selecting section 104 is provided with 16 switches S/W1a to S/W16a. The 16 switches S/W1a to S/W16a are respectively connected to 16 nodes selected by the first divided-voltage selecting section 102, among the nodes formed in the divided-voltage generating section 101.

Therefore, the second divided-voltage selecting section 104 selects and outputs one desired voltage among 16 divided-voltages selected by the first divided-voltage selecting section 102 on the basis of the selection signal output from the decoder section 103.

The decoder section 103 receives an 8-bit digital signal from outside. The decoder section 103 is composed of a first decoder 103a which decodes four higher-order bits of the 8-bit digital signal output from outside so as to output a decoded selection signal and a second decoder 103b which decodes four lower-order bits thereof so as to output a decoded selection signal.

The first divided-voltage selecting section 102 first selects 16 divided-voltages among the 256 divided-voltages generated from the first divided-voltage generating section 101 on the basis of the selection signal output from the first decoder 103a.

The second divided-voltage selecting section 104 selects one desired voltage among 16 divided-voltages selected by the first divided-voltage selecting section 102 on the basis of the selection signal output from the second decoder 103b.

The voltage output section 105 is composed of an output buffer 105a which buffers and outputs one voltage selected by the second divided-voltage selecting section 104.

Therefore, the voltage selected by the second divided-voltage selecting section 104 is output to an output terminal through the output buffer 105a. Accordingly, an analog output voltage corresponding to the 8-bit digital signal output from outside is output through the output terminal of the digital/analog converter which processes a digital signal with an 8-bit resolution.

FIG. 2 is a block diagram illustrating the construction of a conventional digital/analog converter which processes a digital signal with a 10-bit resolution.

As shown in FIG. 2, the conventional digital/analog converter, which processes a digital signal with a 10-bit resolution, is composed of a first divided-voltage generating section 201 which divides a reference supply voltage through the voltage distribution, a decoder section 203 which receives a digital signal so as to output a decoded selection signal, a first divided-voltage selecting section 202 which selects and outputs a plurality of divided-voltages among the divided-voltages generated from the first divided-voltage generating section 201 on the basis of the output selection signal, a second divided-voltage selecting section 204 which selects and outputs a plurality of divided-voltages among the divided-voltages output from the first divided-voltage selecting section on the basis of the output selection signal, and a voltage output section 205 which outputs predetermined voltages selected from the second divided-voltage selecting section.

Different from the first divided-voltage generating section 101 of FIG. 1, the first divided-voltage generating section 201 is composed of $1024(2^{10})$ or $1025(2^{10}+1)$ resistors which are serially connected, because the digital/analog converter processes a digital signal with 10-bit resolution. One end thereof receives the reference supply voltage VDD, and the other end thereof is connected to the ground GND of the circuit. Further, predetermined divided-voltages VR1 to VR1024 are respectively output from the connection points between the resistors R0 to R1024, that is, the nodes formed between the respective resistors of the first divided-voltage generating section 201.

For example, if the connection point between the resistors R1 to R2 is set to the first node and the total resistance of 1025 serially-connected resistors is referred to as Rtot, a divided-voltage VRn which is output from the Nth node can be calculated by the following equation: $Vn=(R0+R1+\ldots+Rn-1)/Rtot \times VDD$ (n is in the range of 1 to 1024).

Different from the first divided-voltage selecting section 102 of FIG. 1, the first divided-voltage selecting section 202 is provided with 1024 switches S/W1 to S/W1024. The switches S/W1 to S/W1024 are respectively connected to the nodes formed in the divided-voltage generating section 201.

The first divided-voltage selecting section 202 selects and outputs 32 divided-voltages among 1024 divided-voltages generated by the divided-voltage generating section 201 on the basis of a selection signal output from the decoder section 203 which will be described below.

The second divided-voltage selecting section 204 is provided with 32 switches S/W1a to S/W32a. The 32 switches S/W1a to S/W32a are respectively connected to 32 nodes which are selected by the first divided-voltage selecting section 202 among the nodes formed in the divided-voltage generating section 201.

The second divided-voltage selecting section 204 selects and outputs one desired voltage among 32 divided voltages selected by the first divided-voltage selecting section 202 on the basis of the selection signal output from the decoder section 203.

The decoder section 203 receives a 10-bit digital signal from the outside. The decoder section 203 is composed of a first decoder 203a which decodes five higher-order bits of the 10-bit digital signal output from outside so as to output a decoded selection signal and a second decoder 203b which decodes five lower-order bits thereof so as to output a decoded selection signal.

Therefore, the first divided-voltage selecting section 202 first selects 32 divided-voltages among 1024 divided-voltages generated from the first divided-voltage generating section 201 on the basis of the selection signal output from the first decoder 203a.

The second divided-voltage selecting section 204 selects one desired voltage among 32 divided-voltages selected from the first divided-voltage selecting section 202 on the basis of the selection signal output from the second decoder 203b.

The voltage output section 205 is composed of an output buffer 205a which buffers and outputs one voltage selected by the second voltage selecting section 204.

The voltage selected by the second divided-voltage selecting section 204 is output to an output terminal through the output buffer 205a. Accordingly, the output voltage of an analog signal corresponding to the 10-bit digital signal input from outside is output through the output terminal of the digital/analog converter which processes a digital signal with a 10-bit resolution.

However, in the conventional digital/analog converter which processes a digital signal with an 8-bit resolution as described above, there are provided the divided-voltage generating sections and divided-voltage selecting sections which are suitable for processing a digital signal with an 8-bit resolution. Therefore, it is impossible to process a digital signal with high resolution of more than 10 bits.

Further, in the conventional digital/analog converter which processes a digital signal with a 10-bit resolution as described above, high resolution of more than 10 bits can be obtained. However, since the number of resistors composing the divided-voltage generating section and switches composing the divided-voltage selecting section increases, the area of the circuit also increases.

Furthermore, in the conventional digital/analog converter which processes a digital signal with an 8-bit and 10-bit resolution as described above, a desired voltage cannot be output quickly because of the influence of a parasitic capacitor which is present in a switch or the like.

SUMMARY OF THE INVENTION

An advantage of the present invention is that it provides a divided-voltage storing section and divided-voltage selecting section are added in a conventional digital/analog converter which processes a digital signal with an 8-bit resolution, so that a digital signal with a high resolution of more than 10 bits can be processed, the size of an IC on which the digital/analog converter is mounted can be reduced by miniaturizing the digital/analog converter, and a desired voltage can be output quickly.

Additional aspects and advantages of the present general inventive concept will be set forth in part in the description which follows and, in part, will be obvious from the description, or may be learned by practice of the general inventive concept.

According to an aspect of the invention, a digital/analog converter includes a divided-voltage generating section that divides a reference supply voltage through the voltage distribution; a decoder section that receives a digital signal so as to output a decoded selection signal; a first divided-voltage selecting section that selects and outputs a plurality of divided voltages among the divided-voltages generated from the divided-voltage generating section on the basis of the selection signal output from the decoder section; a second divided-voltage selecting section that selects and outputs a plurality of divided-voltages among the divided-voltages output from the first divided-voltage selecting section on the basis of the selection signal output from the decoder section; a divided-voltage storing section that charges and discharges the plurality of divided-voltages output from the second divided-voltage selecting section; a third divided-voltage selecting section that selects a predetermined voltage among the divided-voltages discharged from the divided-voltages storing section on the basis of the selection signal output from the decoder; and a voltage output section that outputs the predetermined voltage selected from the third divided-voltage selecting section.

The divided-voltage generating section is composed of a plurality of serially-connected resistance elements.

The first divided-voltage selecting section is composed of a plurality of switches which are connected to a plurality of nodes formed in the divided-voltage generating section.

The second divided-voltage selecting section is composed of a plurality of switches which are connected to the plurality of nodes selected by the first divided-voltage selecting section and the nodes adjacent to the nodes selected by the first divided-voltage selecting section, among the nodes formed in the divided-voltage generating section.

The voltage of the plurality of nodes selected by the first divided-voltage selecting section is selected as a high voltage, and the voltage of the nodes adjacent to the plurality of nodes selected by the first divided-voltage selecting section is selected as a low voltage.

The divided-voltage storing section includes a first capacitor that charges and discharges the high voltage; a second capacitor that charge and discharges the low voltage; a first switch that is connected to the first capacitor and the node having a divided-voltage selected as the high voltage; a second switch that is connected to the second capacitor and the node having a divided-voltage selected as the low voltage; a third switch that is connected to the first capacitor and the third divided-voltage selecting section; and a fourth switch that is connected to the second capacitor and the third divided-voltage selecting section.

The third divided-voltage selecting section includes fifth and sixth switches that are connected to the high or low voltage; a first resistor that is connected to the fifth switch so as to receive the high or low voltage; a second resistor that is connected to the sixth switch so as to receive the high or low voltage; and a third resistor that receives the low voltage.

The first to third resistors are connected in parallel.

The second and third resistors have the same resistance value, and the first resistor has one half of the resistance value of the second and third resistors.

The voltage output section is composed of an output buffer which buffers and outputs a predetermined voltage selected by the third divided-voltage selecting section.

The predetermined voltage is fed back to the output buffer, as a side input.

The plurality of switches are implemented of transistors.

The first to fourth switches are implemented of transistors.

The fifth and sixth switches are implemented of transistors.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a block diagram showing the construction of a conventional digital/analog converter which processes a digital signal with an 8-bit resolution;

FIG. 2 is a block diagram showing the construction of a conventional digital/analog converter which processes a digital signal with a 10-bit resolution;

FIG. 3 is a block diagram showing the construction of a digital/analog converter according to an embodiment of the present invention; and FIGS. 4A to 4D are diagrams showing a process where a third divided-voltage selecting section of the invention selects one voltage desired by a user.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Hereinafter, preferred embodiments of the present invention will be described in detail with reference to the accompanying drawings.

FIG. 3 is a block diagram showing the construction of a digital/analog converter according to an embodiment of the invention.

As shown in FIG. 3, the digital/analog converter according to the invention is composed of a divided-voltage generating section 301 which divides a reference supply voltage VDD through the voltage distribution, a decoder section 303 which receives a digital signal so as to output a decoded selection signal, a first divided-voltage selecting section 302 which selects and outputs a plurality of divided-voltages among the divided-voltages generated from the divided-voltage generating section 301 on the basis of the output selection signal, a second divided-voltage selecting section 304 which selects and outputs a plurality of divided-voltages among the divided-voltages output from the first divided-voltage selecting section on the basis of the output selection signal, a divided-voltage storing section 305 which charges and discharges the plurality of divided-voltages output from the second divided-voltage selecting section, a third divided-voltage selecting section 306 which selects a predetermined voltage among the divided-voltages discharged from the divided-voltage storing section on the basis of the output selection signal, and a voltage output section 307 which outputs the predetermined voltage selected by the third divided-voltage selecting section.

The divided-voltage generating section 301 is composed of 256 or 257 resistances which are connected in series. One end thereof receives the reference supply voltage VDD, and the other end thereof is connected to a ground GND of the circuit. Further, predetermined divided-voltages VR1 to VR256 are respectively output from the connection points between the resistors R0 to R256, that is, nodes formed between the resistors of the first divided-voltage generating section 301.

For example, if the connection point between the resistances R1 and R2 is set to the first node and the total resistance of 257 serially-connected resistors is referred to as Rtot, a divided-voltage VRn which is output from the Nth node can be calculated by the following equation: $V_n=(R_0+R_1+\ldots+R_{n-1})/R_{tot}\times VDD$ (n is in the range of 1 to 256).

The first divided-voltage selecting section 302 is provided with 256 switches S/W1 to S/W256 which are all composed of transistors. The respective switches S/W1 to S/W256 are respectively connected to the nodes formed in the divided-voltage generating section 301.

The first divided-voltage selecting section 302 selects and outputs 16 divided-voltages among 256 divided-voltages generated by the divided-voltage generating section 301 on the basis of the selection signal output from the decoder section 303 which will be described below.

In the related art, when a digital signal with a 10-bit resolution is processed, $1024(2^{10})$ resistors and 1024 switches are needed to divide a reference supply voltage. In the present invention, however, only $256(2^8)$ or $257(2^8+1)$ resistances and 256 switches are needed, which are required for processing a digital signal with an 8-bit resolution. Therefore, the size of an IC on which a digital/analog converter is mounted can be reduced, which satisfies the miniaturization thereof according to current technology trends.

The second divided-voltage selecting section 304 is provided with 32 switches S/W1a to S/W32a which are composed of transistors. The switches S/W1a to S/W32a are respectively connected to 16 nodes selected from the first divided-voltage selecting section 302 and nodes which are respectively adjacent to the 16 nodes and have a lower voltage than the divided-voltage of the 16 nodes, among the nodes formed in the divided-voltage generating section 301.

Therefore, the second divided-voltage selecting section 304 selects one divided-voltage as a high voltage among the 16 divided-voltages selected by the first divided-voltage selecting section 302 on the basis of the selection signal output by the decoder section 303, and selects a divided-voltage of the node adjacent to the node having the selected divided-voltage as a low voltage, thereby outputting two divided-voltages.

The decoder 303 receives a 10-bit digital signal from the outside. The decoder section 303 is composed of a first decoder 303a which decodes four higher-order bits (first high-order bits) of the 10-bit digital signal output from the outside so as to output a decoded selection signal, a second decoder 303b which decodes four following bits (second high-order bits) thereof so as to output a decoded selection signal, and a third decoder 303c which decodes two lower-order bits thereof so as to output a decoded selection signal.

On the basis of the selection signal output from the first decoder 303a, the first divided-voltage selecting section 302 first selects 16 divided voltages among the 256 divided-voltages generated from the divided voltage generating section 301.

On the basis of the selection signal output from the second decoder 303b, the second divided-voltage selecting section 304 selects one divided-voltage as a high voltage among the 16 divided-voltages selected by the first divided-voltage selecting section 302, and selects the divided-voltage of the node adjacent to the node having the selected divided-voltage as a low voltage.

On the basis of the selection signal output from the third decoder 303c, a third divided-voltage selecting section 306, which will be described below, selects one desired voltage among the divided-voltages discharged from the divided-voltage storing section 305.

The divided-voltage storing section 305 is composed of a first capacitor 305a which charges and discharges the high voltage selected by the second divided-voltage selecting section 304, a second capacitor 305b which charges and discharges the low voltage, a first switch 305c which is connected to the first capacitor 305a and the node having the divided-voltage selected as the high voltage, a second switch 305d which is connected to the second capacitor 305b and the node having the divided-voltage selected as the low voltage, a third switch 305e which is connected to the first capacitor 305a and the third divided-voltage selecting section 306, and a fourth switch 305f which is connected to the second capacitor 305b and the third divided-voltage selecting section 306.

The divided-voltage storing section 305 having such a construction first turns on the first and second switches 305c and 305d so as to charge the first capacitor 305a with the high voltage and to charge the second capacitor 305b with the low voltage.

At this time, the third and fourth switches 305e and 305f which are connected to the third divided-voltage selecting section 306 should be turned off. If the third and fourth switches 305e and 305f are turned off, a current path is formed in the third divided-voltage selecting section 306, so that the voltage of each node of the divided-voltage generating section 301 is not maintained. Then, it is impossible to output the same voltage as a voltage desired by a user.

If the first and second capacitors 305a and 305b are respectively charged with the high and low voltages, the first and second switches 305c and 305d are turned off and the third and fourth switches 305e and 305f are turned on, thereby discharging the high and low voltages.

Since such a charging and discharging operation is performed by using a small number of capacitors, a voltage desired by a user can be output more quickly than in a conventional digital/analog converter.

The third divided-voltage selecting section 306 is composed of fifth and sixth switches 306a and 306b which are connected to the high or low voltage, a first resistor 306c which is connected to the fifth switch 306a so as to receive the high or low voltage, a second resistor 306d which is connected to the sixth switch 306b so as to receive the high or low voltage, and a third resistance 306e which receives the low voltage.

The first to third resistors 306c to 306e are connected in parallel. The second and third resistors 306d and 306e have the same resistance value, and the first resistor 305c has one half of the resistance value of the second and third resistors 306d and 306e.

On the basis of the selection signal output from the third decoder 303c of the decoder section 303, the third divided-voltage selecting section 306 having such a construction divides the divided-voltage, discharged by the divided-voltage storing section 305, into four voltages. Then, the third divided-voltage selecting section 306 selects and outputs one desired voltage among them.

Here, since the third divided-voltage selecting section 306 is constructed by using the first to third resistors 306c and 306e and the fifth and sixth switches 306a and 306b, each of 256 divided-voltages generated by the divided-voltage generating section 301 is divided into four voltages, which means there is the same effect when the divided-voltage generating section 301 is composed of 1024 resistors. Therefore, according to the present invention, the digital/analog converter has such an advantage that the size thereof becomes smaller than that of a conventional digital/analog converter with a 10-bit resolution.

FIGS. 4A to 4D are diagrams showing a process where the third divided-voltage selecting section 306 selects one voltage desired by a user. When the divided-voltage storing section 305 turns on the third and fourth switches 305e and 305f so as to discharge the high and low voltages, a different voltage is selected as follows, in accordance with the operation of the fifth and sixth switches 306a and 306b. Then, the voltage is output through the voltage output section 307 which will be described below.

When the fifth and sixth switches 306a and 306b are connected to the high voltage as shown in FIG. 4A, a current path P1 is formed. Accordingly, if the Kirchhoff's current law is applied with respect to the node A which is commonly connected to the first to third resistors 306c to 306e, the following equation is derived:

$$Vout=Vlow+\tfrac{3}{4}(Vhigh-Vlow).\qquad\text{[Equation 1]}$$

When the fifth switch 306a is connected to the high voltage and the sixth switch 306b is connected to the low voltage as shown in FIG. 4B, a current path P2 is formed. As in FIG. 4A, if the Kirchhoff's current law is applied with respect to the node A, the following equation is derived:

$$Vout=Vlow+\tfrac{2}{4}(Vhigh-Vlow).\qquad\text{[Equation 2]}$$

When the fifth switch 306a is connected to the low voltage and the sixth switch 306b is connected to the high voltage as shown in FIG. 4C, a current path P3 is formed. If the Kirchhoff's current law is applied with respect to the node A, the following equation is derived:

$$Vout=Vlow+\tfrac{1}{4}(Vhigh-Vlow).\qquad\text{[Equation 3]}$$

Finally, when the fifth and sixth switches 306a and 306b are connected to the low voltage as shown in FIG. 4D, a current path P4 is formed. If the Kirchhoff's current law is applied with respect to the node A, the following equation is derived:

$$Vout=Vlow.\qquad\text{[Equation 4]}$$

One of the four equations is selected on the basis of the selection signal output from the third decoder 303c of the decoder 303. Then, the voltage derived by the selected equation is output.

Table 1 shows Equations 1 to 4. Here, D1 and D2 mean the fifth and sixth switches 306a and 306b, respectively. 1 means the connection to the high voltage, and 0 means the connection to the low voltage.

TABLE 1

| D1 | D2 | Vout |
|---|---|---|
| 1 | 1 | Vout = Vlow + 3/4 (Vhigh − Vlow) |
| 1 | 0 | Vout = Vlow + 2/4 (Vhigh − Vlow) |
| 0 | 1 | Vout = Vlow + 1/4 (Vhigh − Vlow) |
| 0 | 0 | Vout = Vlow |

The voltage output section 307 is composed of an output buffer 307a which buffers and outputs one voltage selected by the third divided-voltage selecting section 306. The selected voltage is fed back to the output buffer 307a, as a side input.

The voltage selected by the third divided-voltage selecting section 306 is output to an output terminal through the output buffer 307a. Accordingly, the output voltage of an analog signal corresponding to a 10-bit digital signal output from the outside is output through the output terminal of the digital/analog converter according to the present invention.

As in the related art, the output buffer 307a is used in the voltage output section 307. Accordingly, it is possible to realize a desired voltage and driving speed and to prevent the flickering of the distributed voltage.

According to the digital/analog converter of the present invention, the divided-voltage generating section and the divided-voltage selecting section are respectively added in the conventional digital/analog converter which processes a digital signal with an 8-bit resolution. Accordingly, a digital signal with a high resolution of more than 10 bits can be processed, the size of the digital/analog converter is reduced so that the size of an IC on which the digital/analog converter is mounted can be reduced, and a desired voltage can be output quickly.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A digital/analog converter comprising:
   a divided-voltage generating section that divides a reference supply voltage into a plurality of divided-voltages through a voltage distribution comprising a plurality of nodes;
   a decoder section that receives a digital signal so as to output a decoded selection signal;
   a first divided-voltage selecting section that selects a first set of nodes from the divided-voltage generating section and outputs a first set of divided voltages based upon the decoded selection signal;
   a second divided-voltage selecting section that selects and outputs a second set of divided-voltages from among the first set of divided-voltages on the basis of the decoded selection signal;
   a divided-voltage storing section that charges and discharges the second set of divided-voltages output from the second divided-voltage selecting section;
   a third divided-voltage selecting section that selects a predetermined voltage among the divided-voltages discharged from the divided-voltage storing section on the basis of the decoded selection signal; and
   a voltage output section that outputs the predetermined voltage selected from the third divided-voltage selecting section;
   wherein the first divided-voltage selecting section includes a plurality of switches connected to the plurality of nodes formed in the divided-voltage generating section;
   wherein the second divided-voltage selecting section includes a plurality of switches connected to the first set of selected nodes, and to nodes adjacent to the first set of selected nodes; and
   wherein a voltage associated with the first set of selected nodes is selected as a high voltage, and a voltage associated with the nodes adjacent to the first set of selected nodes is selected as a low voltage.

2. The digital/analog convener according to claim 1, wherein the divided-voltage generating section is composed of a plurality of serially-connected resistance elements.

3. The digital/analog converter according to claim 1, wherein the first divided-voltage selecting section is composed of a plurality of switches which are connected to the plurality of nodes formed in the divided-voltage generating section.

4. The digital/analog converter according to claim 3, wherein the plurality of switches are implemented of transistors.

5. The digital/analog converter according to claim 1,
wherein the second divided-voltage selecting section is composed of a plurality of switches connected to the first set of selected nodes and to the nodes adjacent to the first set of selected nodes.

6. The digital/analog converter according to claim 1,
wherein the divided-voltage storing section includes:
a first capacitor that charges and discharges the high voltage;
a second capacitor that charge and discharges the low voltage;
a first switch that is connected to the first capacitor and the node having a divided-voltage selected as the high voltage;
a second switch that is connected to the second capacitor and the node having a divided-voltage selected as the low voltage;
a third switch that is connected to the first capacitor and the third divided-voltage selecting section; and
a fourth switch that is connected to the second capacitor and the third divided-voltage selecting section.

7. The digital/analog converter according to claim 6,
wherein the third divided-voltage selecting section includes:
fifth and sixth switches that are connected to the high or low voltage;
a first resistor that is connected to the fifth switch so as to receive the high or low voltage;
a second resistor that is connected to the sixth switch so as to receive the high or low voltage; and
a third resistor that receives the low voltage.

8. The digital/analog converter according to claim 7,
wherein the first to third resistors are connected in parallel.

9. The digital/analog converter according to claim 8,
wherein the second and third resistors have the same resistance value, and the first resistor has one half of the resistance value of the second and third resistors.

10. The digital/analog converter according to claim 7,
wherein the fifth and sixth switches are implemented of transistors.

11. The digital/analog converter according to claim 6,
wherein the first to fourth switches are implemented of transistors.

12. The digital/analog converter according to claim 1,
wherein the voltage output section is composed of an output buffer which buffers and outputs a predetermined voltage selected by the third divided-voltage selecting section.

13. The digital/analog converter according to claim 10,
wherein the predetermined voltage is fed back to the output buffer, as a side input.

* * * * *